United States Patent [19]

Gimpelson et al.

[11] Patent Number: 4,705,597
[45] Date of Patent: Nov. 10, 1987

[54] PHOTORESIST TAPERING PROCESS

[75] Inventors: George E. Gimpelson, Indialantic; Cheryl L. Holbrook; Anthony L. Rivoli, both of Palm Bay, all of Fla.

[73] Assignee: Harris Corporation, Melbourne, Fla.

[21] Appl. No.: 723,239

[22] Filed: Apr. 15, 1985

[51] Int. Cl.⁴ .................. B44C 1/22; H01L 21/312
[52] U.S. Cl. ................................ 156/643; 156/644; 156/659.1; 156/668; 156/646; 430/328; 430/330
[58] Field of Search .......... 156/643, 644, 646, 659.1, 156/668; 430/313, 317, 328, 330

[56] References Cited

U.S. PATENT DOCUMENTS 4,187,331  2/1980  Ma ........................... 430/317
4,326,936  4/1982  Jones ........................ 156/643
4,369,090  1/1983  Wilson et al. ............. 156/644
4,436,584  3/1984  Bernacki et al. .......... 156/643
4,484,979 11/1984  Stocker ..................... 156/643

Primary Examiner—S. Leon Bashore
Assistant Examiner—Andrew J. Anderson
Attorney, Agent, or Firm—Thomas N. Twomey; Charles C. Krawczyk; William A. Troner

[57] ABSTRACT

Photoresist apertures having tapered sidewalls can be provided by first opening the aperture in accordance with ordinary practice followed by the exposure of the photoresist to a suitable energy source such as a flood exposure to wideband light, the heating of the photoresist to round the peripheral edges of the aperture and the exposure of the thus pretreated photoresist to an environment which removes photoresist from the inside wall of the aperture until the desired tapered profile is obtained. In the preferred practice of the invention, the pretreated photoresist is removed from the inside wall of the aperture through exposure to a dry oxygen plasma etch.

10 Claims, 9 Drawing Figures

PHOTORESIST TAPERING PROCESS

BACKGROUND AND SUMMARY OF THE INVENTION

The present invention relates generally to semiconductor device manufacture and, particularly, to improvements in plasma planarization of semiconductor device layers and the formation of interlevel interconnect locations. More specifically, the present invention relates to an improved photoresist aperture profile and the process for creating the improved aperture profile.

As integrated circuit geometries increase in complexity and decrease in dimensions it becomes increasingly important to provide component layers with smooth or planar surface topographies. Steps often inhibit proper application of additional device layers. In the fabrication of multilevel devices it is generally necessary to form apertures through one device layer to an underlying layer. The sidewall height and angle of these apertures is generally too abrupt for good metal coverage.

To reduce sidewall angles and soften edges, previous fabrication processes have included high temperature "reflow" techniques. The substrate and glass thereon would be heated to temperatures where the glass softens and starts to melt. The substrate, however, maintains its stability at these temperatures. Unfortunately, reflow techniques have often proved unsatisfactory where metal is used. To insulate these paths, oxide layers are typically applied between them. These oxide layers substantially conform to the underlying surface topography. Thus, subsequent paths applied directly to the oxide would not have a planar base surface. Without a planar base surface, designing complex, multi-layer circuits become extremely difficult. Attempts to apply reflow techniques to the oxide layers are not succesful. Temperatures high enough to soften the oxide and cause it to flow will also cause underlying metal paths to melt or peel off adjacent layers or alloy with the silicon. This results in silicon surface pits and resultant device failures. Further, such high temperature processing is often not reliable and will generally enlarge device dimensions and promote poor feature size control which subsequently causes loss of device packing density.

Recently, low temperature plasma etching techniques for smoothing rough and irregular surface topographies have been developed. These are often referred to as "plasma planarization" or "plasma filing". As seen in the sectional view of FIG. 1, plasma planarization typically involves the use of a sacrificial layer 10 which is applied over rough topography 20 of insulating layer 30. Rough topography 20 may, for example, result from conformity of insulating layer 30 to metal path 40 formed on insulative layer 50 of substrate base 60. Prior research and experimentation have been directed toward achieving a planar surface 15 on sacrificial layer 10. This multi-layered product is subjected to plasma etching in a gas environment to completely remove sacrifical layer 10 and portions of insulating layer 30. Sacrificial layer 10 is etched away at the same rate as the material of insulating layer 30. As a result, the topography of relatively smooth surface 15 can be replicated on the surface 20 of insulating layer 30 without detrimentally affecting metal path 40.

Such plasma planarization techniques have been used to smooth surfaces of several materials, including polysilicon, nitrides, and various glasses. A variety of sacrificial layers have also been used, including photoresists, polyimide, and nitrides. Unfortunately, while previous plasma planarization techniques may be suitable for fabrication of some larger, less detailed integrated circuits, they do not produce surfaces which are sufficiently planar for many smaller and more complex circuit devices.

Further difficulties also arise with the relatively narrow processing constraints of these prior techniques. According to these prior techniques, the ratio of the etch rates of the sacrificial layer to the underlying insulating layer must, as nearly as possible, be unity if the topography of surface 15 is to be properly replicated. Even the smallest deviation from a unity ratio is considered undesirable.

A solution of the above difficulties has been described in copending U.S. Ser. No. 591,597, now U.S. Pat. No. 4,515,652, entitled "Plasma Sculpturing With A Non-Planar Sacrificial Layer" and owned by the assignee of the present invention. The copending application describes a method of plasma planarization of the surface topography of a substrate layer wherein a sacrificial layer, having an etch rate substantially different from the etch rate of the substrate layer, is applied to the surface topography of that substrate layer. The sacrificial and substrate layers are then plasma etched to remove the sacrificial layers and portions of the substrate layer. The ratio of substrate to sacrificial layer etch rate can be controlled to compensate for non-planar surface features of the sacrificial layer such that the resulting substrate surface topography is planar. Control of this etch rate ratio is accomplished by selecting appropriate materials forming the sacrificial layer for a given plasma environment and by selecting the appropriate plasma environment for a given material forming the sacrificial layer. This process is a "low temperature" process which is suitable for multilayer devices which may have previously applied metal contacts or lines that could be damaged by temperatures high enough, for instance, to cause photoresist to melt or flow.

The present invention relates to an improved method of fabricating semiconductor devices, and more particularly to the fabrication of devices incorporating multilevel interconnect technology.

A desirable process for the fabrication of multilevel interconnect semiconductor devices would provide smoothing of the interlevel dielectric, etching of vias which will be used for interlevel connections and tapering of the vias to improve interconnect step coverage into the vias without requiring high temperatures. The present invention relates to a novel and easily implemented method of tapering the via by providing a tapering of the via photoresist which is transferred to the oxide during the erosion of the photoresist. Prior methods of tapering the photoresist have not been easily controlled thus it was difficult if not impossible to obtain uniformity in the manufactured end products.

Gwozdz, U.S. Pat. No. 4,451,326 issued May 29, 1984 is illustrative of the attempts being made to provide an improved via profile for facilitating good metal coverage in the via. The multi-step process described by Gwozdz is cumbersome and only serves to reduce the step height into the via. Gwozdz recognized the need to provide improved metal coverage but was not able to provide a commercially feasible solution.

Non-vertical sidewalls have previously resulted in an uncontrolled manner from excessive heating during bake out of photoresist causing it to melt and flow into the aperture. Notwithstanding the desire to improve metal step coverage, it has been found that photomask sidewall shaping at melting or near-melting temperatures is nearly impossible to controllably reproduce and generally, that the melt and flow of photoresist can be more detrimental than beneficial in a high-yield semiconductor manufacture process. A description of this technique is provided by Kern and Rosier, "Advances in Deposition Processes for Passivation Films" J. Vac. Sci. Technical, Vol. 14, No. 5, September/October 1977.

It is also noted that photoresist erosion sometimes occurs during etching of the aperture of the underlying oxide. While this erosion can result in a tapered photoresist aperture sidewall, such uncontrolled erosion does not provide the controlled taper desired for consistent and reliable semiconductor manufacture where high yield is dependent on tapered photoresist sidewalls. Consistency and reliability can only be provided if the photoresist is provided with a preselected and controlled taper.

It is an object of the present invention to provide a tapered profile to a photoresist opening.

It is a further object of the present invention to provide a tapered photoresist opening without requiring any increase in the number of process steps beyond those ordinarily required for forming a photoresist opening.

These and other objects are accomplished according to the present invention which allows a taper to be imparted to a photoresist opening by rounding the peripheral edge of the opening and then faceting the inner surface of the photoresist opening. The rounding of the peripheral edge of the photoresist opening results in the exposure of a surface along which a facet will be preferentially etched during an ensuing etch step. Thus, the exposed inner surface of the opening will be tapered at the angle defined by the preferential etch characteristics of the photoresist and the etch process utilized. In order for the photoresist to exhibit the desired faceting characteristics during the plasma etch, it is necessary to alter the photoresist by a pretreatment comprising exposure to a suitable energy source.

The opening of a preferentially profiled aperture in a photoresist without any increase in the number of process steps is accomplished pursuant the present invention as described herein with reference to the accompanying drawings.

FIGS. $7_a$, $7_b$ and $7_c$ show the progressive stages of oxide aperture formation facilitated by the present invention.

Figure 1:
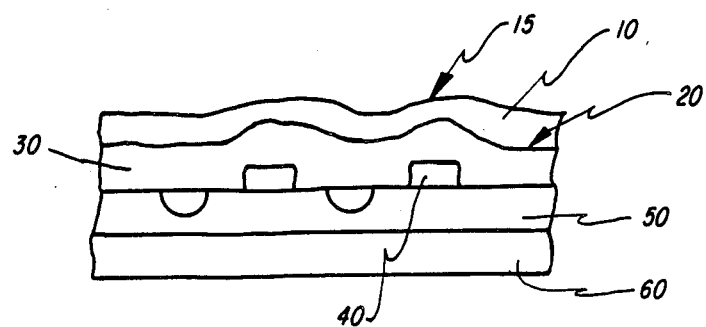
FIG. 1 is an illustration of a multilayer structure which has been constructed to facilitate a plasma sculpturing process.
Figure 2:
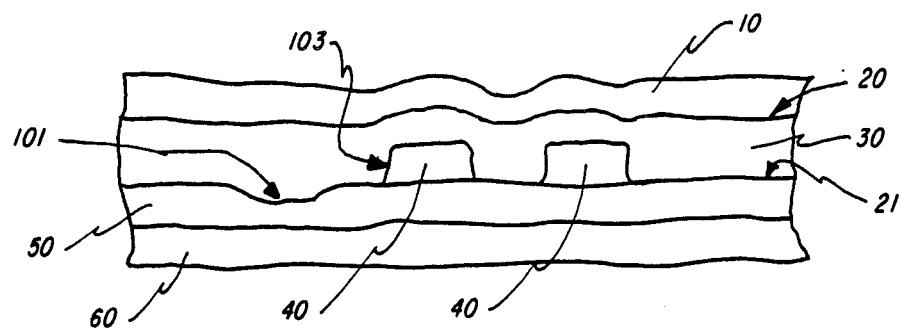
FIG. 2 is an illustration of a non-planar layer of semiconductor material having both devices and conductors which cause variations from planarity.

FIG. 2 illustrates a non-planar semiconductor surface 21 showing irregularities resulting from both device 101 and conductor 40 formation on a first level 50 of a multi-level semiconductor device. The surface irregularities include steps 103 some of which are sufficiently high and steep so as to render subsequent layer coverage unsatisfactory due to difficulties in obtaining consistent and uniform coverage. It may be particularly difficult to obtain metal coverage over such steps. Thus, a planarization layer 30 may be applied over the non-planar semiconductor surface. The planarization layer should be of a highly conforming material which will provide good step coverage. A suitable planarization layer can be formed of silicon dioxide. Planarization may then be obtained according to the method of commonly owned copending application Ser. No. 591,597 filed Mar. 20, 1984 and entitled "Plasma Sculpturing with a Non-Planar Sacrificial Layer", which is hereby incorporated by reference. This method may use a photoresist or masking layer 10 over the planarization layer 30 which provides still further planarization.

Figure 3:
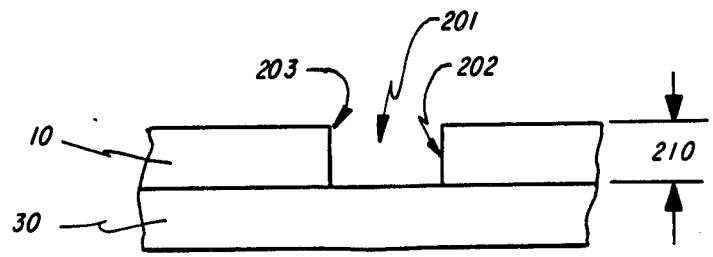
FIG. 3 is an illustration of an aperture through a mask layer.

Apertures 201 between the various device layers are preferably made as small as practicable while providing a sufficient opening for the establishing of the desired electrical interconnection. FIG. 3 shows an aperture through a masking layer 10 for illustration of the particular points of interest. Specifically, the aperture 201 is defined by sidewall 202 which has a peripheral edge 203. As previously described, if the step height 210 and side-wall steepness are too great it will be detrimental to end product reliability. Thus, according to the present invention, a method of facilitating the formation of tapered rather than vertical side-walls is disclosed.

Apertures are opened in areas where electrical contacts are to be made to an underlying device layer. In order to open an aperture, a layer of photoresist is applied and the aperture regions exposed according to conventional photoresist processing steps. This results in an aperture having vertical sidewalls.

In the presently anticipated practice of the invention, the photoresist with apertures having vertical sidewalls can be treated, modified and processed to form a photoresist layer having apertures with reproducibly tapered sidewalls.

It has been discovered that a pretreatment of the photoresist by an appropriate energy source, for instance a blanket exposure to a source of broad spectrum light such as is provided by a Perkin Elmer 240 with an aperture of one and a scan rate of 75, alters the characteristics exhibited by the photoresist when subsequently exposed to a dry etch such as is used in a reactive ion etcher.

Figure 4:
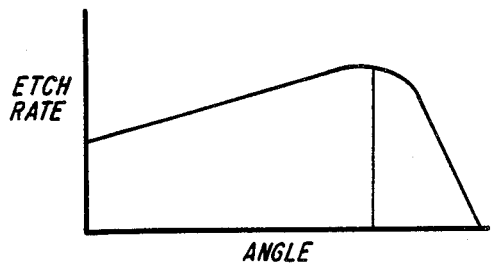
FIG. 4 is a graph showing the relationship between etch rate and angle of incidence of the plasma etch.
Figure 5:
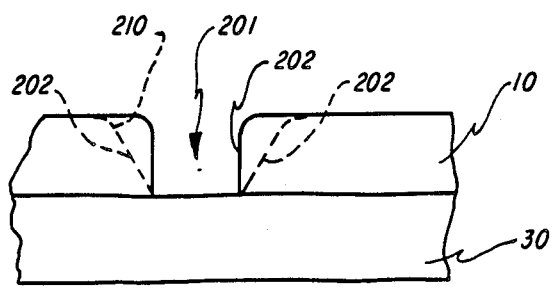
FIG. 5 is a cross section of an aperture in accordance with the invention.

As a result of the above exposure, the photoresist is modified such that the etching process, in this case a dry etch, facets the sidewall along a non-vertical angle as shown in FIG. 5. It has been found that the etch rate of the appropriately pretreated photoresist varies with variations in the angle of incidence of the plasma etch. FIG. 4 shows the relationship of etch rate to the angle of the plasma etch. As can be seen, the preferred etch angle is between about 5° and 45° from vertical thus facilitating formation of a desirable taper. Due to the fact that etching occurs fastest at a particular angle, about 25° in this instance, the slope of the sidewall is ultimately established at this 25° angle.

Figure 6:
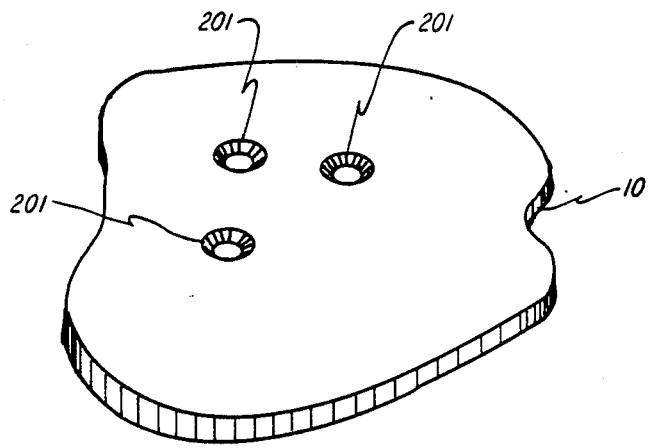
FIG. 6 is a perspective view of the top of the mask layer with a plurality of apertures of the type shown in FIG. 5.
Figure 7A:
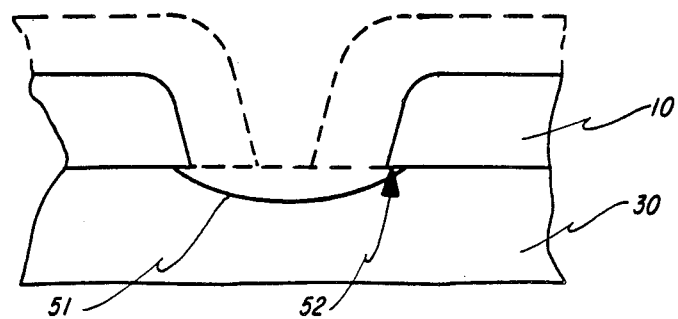
Figure 7B:
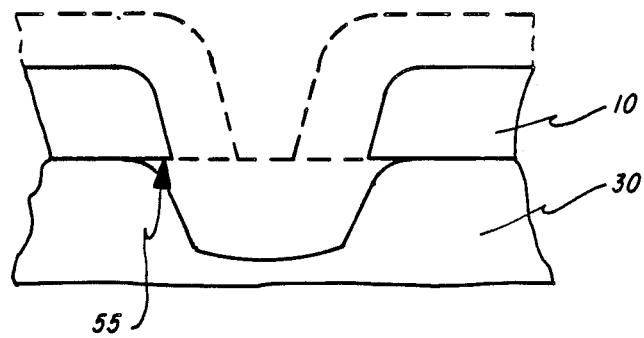
Figure 7C:
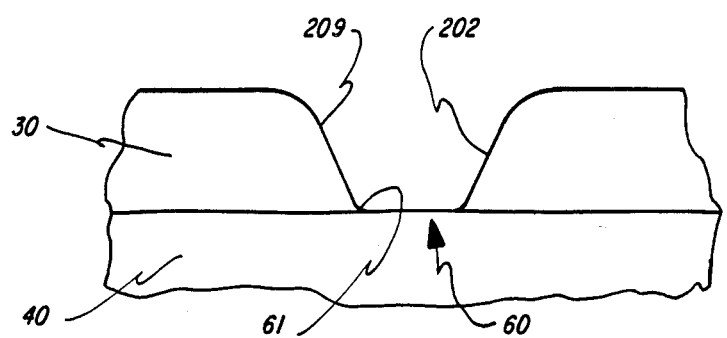

However, the desired faceting may not commence uniformaly at all apertures or evenly around the periphery of a single aperture due to the intial absence of an exposed surface aligned with the preferred facet angle where the tapering can uniformly commence. It has been found that this uncontrolled commencement of the faceting process can be substantially brought under control by rounding the peripheral edges of the aperture prior to commencing the plasma etch. As shown in FIG. 5, this rounding results in the exposure of a curve 210 where the curved edge passes through the desired facet angle and provides a starter location for the preferred facet to be etched. Thus, the entire periphery of each and every aperture will have approximately the same initial beginning characteristics for the faceting process, as shown in FIG. 6 which illustrates a plurality of apertures of the type illustrated in FIG. 5. Refering again to FIG. 5, as the plasma etch proceeds, the preferred facet grows until the inner wall 202 is uniformly etched from its initial vertical angle shown by a solid line to the preferred angle with respect to vertical which is shown by the dashed line.

The rounding of the peripheral edge of an aperture formed in Hunt photoresist 204 may be accomplished by heating to 135° C., a temperature which is higher than necessary for ordinary photoresist baking. This thermal cycling results in a rounded peripheral edge which has a radius of curvature of approximately 0.1 microns or 10% of the photoresist height. It is noted however, that the radius of curvature may range from about 1% to about 25% of the photoresist height.

Rounding is preferred over other techniques for exposing the preferred facet due to the relative ease of obtaining a rounded peripheral edge after the appropriate pretreatment described above. In order to round the peripheral edge of the aperture, the photoresist may be baked at 135° C. for approximately 20 minutes. This causes the peripheral edge to become smoothly rounded. If the heating is maintained sufficiently near 135° C., the edges will become rounded without any excessive or destructive out-gassing or melting such as will occur at substantially higher temperatures. In order to avoid the need for extra process steps, the photoresist may be conveniently heated during an existing photoresist bake step prior to exposing the photoresist to evacuation for plasma etching. This requires that the energy exposure pretreatment described above be completed prior to a photoresist bake step which is already present in the process. Otherwise a separate bake step may be performed.

Having formed the rounded edge, the plasma etch is commenced. The same etch used for photoresist faceting is used for aperture formation in the underlying device layer, typically an oxide. In this manner, no additional plasma etching step is needed. The etch may commence for instance with an $O_2$ plasma which etches the photoresist to the desired taper without etching the oxide. After faceting of the photoresist the oxide etch may be commenced.

In the preferred oxide etch process both the oxide and the photoresist are etched under conditions which establish an oxide etch rate greater than the photoresist etch rate. Additionally, the etch should have both anisotropic and isotropic components. The aperture thus formed in the oxide will have a dual taper providing an optimized surface for subsequent metallization.

A dual taper is formed as shown in FIGS. $7_a$, $7_b$ and $7_c$. When the aperture etch commences, as in $7_a$ the etch has the typical U-shaped cross-section 51 with slight undercutting 52 of the photoresist due to the isotropic component of the plasma etch. As the etch continues, as shown in FIG. $7_b$, the photoresist has been etched at a slower rate than the oxide is etched. Finally, as shown in FIG. $7_c$, the aperture is completed through the oxide 30. As shown, the lower portion of the aperture sidewall 202 is faceted at the preferred etch angle thus having a first taper and the upper portion of the aperture 209 is rounded such that it curves open to provide a relatively smooth transistion to the top of the oxide layer. It has also been found that the bottom 60 of the aperture may have a curved transistion 61 onto the underlying layer 40 thus avoiding the sharp corner that prior aperture forming processes created. In this preferred process, it is easier to get good metal coverage due to the absence of the sharp corners associated with prior processes. This aperture profile will provide for improved step coverage when an electrically conductive material is applied. Previously existing problems associated with via metallization over substantial step heights are obviated by the present invention.

In a relatively broad sense, the present invention need not be limited in use to photoresist notwithstanding that this is presently believed to be the most beneficial application. For instance, any aperture might be conveniently profiled by the general process described herein which includes the creation of a top layer of material through which an aperture is to extend and the opening, through the top, or mask layer of an aperture having sidewalls with a first angle relative to vertical. This first angle might typically be zero degrees or near zero but need not be particularly close to zero degrees. Then, through exposure to an appropriate energy source, such as the dry plasma, the sidewalls are faceted to a second angle relative to vertical. In the usual application, this second angle would be greater than the first angle. However, if there were a reverse taper in the original aperture, the present invention might still be used to advantage even if the second angle were technically smaller than the first angle. The more important factor being that the apertures top opening becomes relatively more open with respect to the bottom of the aperture than existed prior to the practice of the invention.

While the present invention has been described with respect to photo graphic processing, it is intended that such alternative processing techniques as electron and ion beam processing are equivalent to the extent that they can be used to form apertures in a mask layer. Also, for purposes of this application, the term faceting refers to the formation or exposure of a surface which lies at an angle relative to a directed force. Typically, but not necessarily, the directed force described herein is a dry plasma.

In addition to the foregoing description of the invention as applied to creating a tapered profile on an aperture, the present invention may find application in tapering the edge of other layers such as are created for interconnects, thin oxide areas, moats or any other area where a tapered edge is desired. In many of these applications, a top corner of the exposed edge would be treated in the same manner as the wall and peripheral edge of the aperture previously described.

While the present invention has been described with respect to a specific manner of practicing the invention, it is intended that the following claims shall be interpreted in accordance with the full scope of the underlying invention including any and all variations thereof which might be suggested or obvious to these skilled in the semiconductor arts.

What is claimed is:

1. A method of forming a tapered aperture in a photoresist mask layer comprising the steps of:
   creating an aperture having a substantially vertical sidewall in said photoresist mask layer,
   said sidewall having a peripheral edge,
   pretreating said photoresist mask layer by exposing said photoresist mask layer to a source of wideband light followed by heating to round said pheripheral edge while retaining said substantially vertical sidewall, and thereafter,
   exposing said peripheral edge and said substantially vertical sidewall to a plasma whereby the plasma etches said photoresist mask layer along a preferred facet to convert said aperture having a substantially vertical sidewall to an aperture having a tapered sidewall.

2. The method as claimed in claim 1 wherein:
   said peripheral edge remains at least partially rounded throughout said step where said plasma etches said photoresist mask layer.

3. The method claimed in claim 1 wherein:
   said preferred facet is at an angle of between about 5° and 45° from vertical.

4. The method as claimed in claim 1 wherein:
   said step of heating to round said peripheral edge causes said peripheral edge to have a radius of curvature of between 0.01 micron and 0.5 micron.

5. The method as claimed in claim 1 wherein:
   said step of heating to round said peripheral edge causes said peripheral edge to have a radius of curvature of between 1% and 25% of the thickness of the photoresist layer prior to said step of plasma etching.

6. An improved method of creating an aperture in a layer of photoresist comprising the steps of:
   exposing a selected area of said layer of photoresist to an environment which removes said photoresist from said selected area to form an aperture having a substantially vertical sidewall and a peripheral edge,
   pretreating said photoresist with an energy source such that said peripheral edge can be rounded off by subsequent exposure to heat and can then be etched along a preferred facet using a reactive ion etch, and then,
   rounding off said peripheral edge by exposing said peripheral edge to heat, and then,
   etching utilizing a reactive ion etch to taper said sidewall.

7. A method as claimed in claim 6 wherein said photoresist is a positive response photoresist and wherein said step of pretreating is by flood exposure of wideband light.

8. The method claimed in claim 1 wherein said rounded peripheral edge is formed by heating the photoresist to a temperature of about 135° C. for approximately 20 minutes.

9. A method of forming an improved aperture in a semiconductor mask layer comprising the steps of:
   establishing a first layer of semiconductor material,
   establishing a mask layer of photoresist above said first layer, creating an aperture in said mask layer, said aperture having substantially vertical sidewalls and a peripheral edge and
   faceting said sidewalls to an angle relative to vertical by:
      pretreating said peripheral edge by exposure to an appropriate energy source such that,
         said peripheral edge can be rounded by subsequent heating, and can then be etched along a preferred facet using a dry plasma etch,
      after pretreating, heating said peripheral edge to round off said peripheral edge while retaining a substantially vertical sidewall and then exposing said mask layer to a dry plasma etch,
   said angle being such that the aperture has a tapered profile following said faceting.

10. A method of tapering an exposed substantially vertical edge of a photoresist mask layer comprising the steps of:
   providing an exposed substantially vertical edge of a photoresist mask layer, said edge having a top corner;
   exposing said mask layer to an appropriate energy source such that,
      said top corner can be rounded off by subsequent exposure to a heat source and can then be etched along a preferred facet using a plasma etch;
   then heating said top corner to round off said top corner while retaining said substantially vertical edge; and thereafter exposing said rounded off top corner to a plasma whereby said plasma etches said mask layer along a preferred facet.

* * * * *